(12) United States Patent
Zhang

(10) Patent No.: US 12,342,708 B2
(45) Date of Patent: Jun. 24, 2025

(54) DISPLAY PANEL

(71) Applicant: Wuhan China Star Optoelectronics Semiconductor Display Technology Co., Ltd., Hubei (CN)

(72) Inventor: Xiangxiang Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/772,619

(22) PCT Filed: Apr. 22, 2022

(86) PCT No.: PCT/CN2022/088551
§ 371 (c)(1),
(2) Date: Apr. 28, 2022

(87) PCT Pub. No.: WO2023/193311
PCT Pub. Date: Oct. 12, 2023

(65) Prior Publication Data
US 2024/0172539 A1     May 23, 2024

(30) Foreign Application Priority Data

Apr. 7, 2022  (CN) .................. 202210365074.X

(51) Int. Cl.
*H10K 59/121* (2023.01)
*H10K 59/127* (2023.01)
(Continued)

(52) U.S. Cl.
CPC ..... *H10K 59/8791* (2023.02); *H10K 59/1213* (2023.02); *H10K 59/127* (2023.02); *H10K 59/873* (2023.02); *H10K 2102/351* (2023.02)

(58) Field of Classification Search
CPC .................. H10K 59/8791; H10K 59/1213
See application file for complete search history.

(56) References Cited

U.S. PATENT DOCUMENTS 7,247,982 B2    7/2007  Ohshita et al.
10,495,935 B2  12/2019  Nagasawa
(Continued)

FOREIGN PATENT DOCUMENTS

CN          108470749          8/2018
CN          108493198          9/2018
(Continued)

OTHER PUBLICATIONS

Yang et al., "Self-Cleaning and antireflective films for all-glass evacuated tube solar collectors", Science Direct (2015): pp. 226-232. (Year: 2015).*

(Continued)

*Primary Examiner* — Michele Fan

(57) ABSTRACT

A display panel includes a substrate, a thin-film transistor layer disposed on the substrate, an auxiliary layer disposed between the substrate and the thin-film transistor layer and including a first auxiliary layer and at least a second auxiliary layer disposed on a side of the first auxiliary layer close to the substrate. A dielectric constant of a constituent material of the first auxiliary layer is less than a dielectric constant of a constituent material of the substrate and is greater than a dielectric constant of a constituent material of the second auxiliary layer. The second auxiliary layer includes a plurality of auxiliary portions arranged at intervals.

16 Claims, 3 Drawing Sheets

(51) Int. Cl.
*H10K 59/80* (2023.01)
*H10K 102/00* (2023.01)

(56) References Cited

U.S. PATENT DOCUMENTS

| | | | |
|---|---|---|---|
| 10,886,336 B2 | 1/2021 | Park et al. | |
| 11,417,711 B2 | 8/2022 | Park et al. | |
| 11,917,887 B2 | 2/2024 | Shi | |
| 2004/0090401 A1* | 5/2004 | Ohshita | H10K 59/179 345/76 |
| 2012/0074379 A1* | 3/2012 | Tao | H01L 27/153 257/E33.012 |
| 2016/0141348 A1 | 5/2016 | Lin | |
| 2017/0236890 A1 | 8/2017 | Park | |
| 2018/0025969 A1* | 1/2018 | Adusumilli | H01L 33/48 257/751 |
| 2018/0373106 A1* | 12/2018 | Nagasawa | G02F 1/1343 |
| 2019/0096913 A1 | 3/2019 | Lee et al. | |
| 2020/0083309 A1 | 3/2020 | Wang et al. | |
| 2020/0395403 A1* | 12/2020 | Ahmed | G09F 9/33 |
| 2022/0302239 A1* | 9/2022 | Kim | H10K 59/65 |
| 2024/0251632 A1 | 7/2024 | Tang | |

FOREIGN PATENT DOCUMENTS

| | | |
|---|---|---|
| CN | 109962078 | 7/2019 |
| CN | 111192961 | 5/2020 |
| CN | 111725415 | 9/2020 |
| CN | 112002712 | 11/2020 |
| CN | 112928225 | 6/2021 |
| CN | 113241367 | 8/2021 |
| CN | 113871431 | 12/2021 |
| CN | 114122083 | 3/2022 |
| JP | 2004-158321 | 6/2004 |
| JP | 2018-502314 | 1/2018 |
| JP | 2019-008150 | 1/2019 |
| KR | 10-2019-0036962 | 4/2019 |

OTHER PUBLICATIONS

Lee et al., "Light extraction enhancement of InGaN MQW by reducing total internal reflection through surface plasmon effect", Proceedings of SPIE—The International Society for Optical Engineering (2006): pp. 1-8 (Year: 2006).*

Leu, "Synthesis and the structure-property of transparent polyimide films prepared by fluorinated monomers for flexible substrates applications" (2015): pp. 1-4. (Year: 2015).*

International Search Report and the Written Opinion Dated Dec. 16, 2022 From the International Searching Authority Re. Application No. PCT/CN2022/088551 and Its Translation Into English. (17 Pages).

Grounds of Reason of Rejection Dated Oct. 23, 2023 From the Korean Intellectual Property Office Re. Application No. 10-2022-7020188 and Its Translation Into English. (12 Pages).

Notice of Reasons for Refusal Dated May 21, 2024 From the Japan Patent Office Re. Application No. 2022-565852 and Its Translation Into English. (10 Pages).

Notification of Office Action and Search Report Dated Dec. 16, 2024 From The State Intellectual Property Office of the People's Republic of China Re. Application No. 202210365074.X and Its Translation Into English. (17 Pages).

Notice of Reasons for Refusal Dated Nov. 5, 2024 From the Japan Patent Office Re. Application No. 2022-565852 and Its Translation Into English. (10 Pages).

* cited by examiner

DISPLAY PANEL

RELATED APPLICATIONS

This application is a National Phase of PCT Patent Application No. PCT/CN2022/088551 having International filing date of Apr. 22, 2022, which claims the benefit of priority of Chinese Patent Application No. 202210365074.X filed on Apr. 7, 2022. The contents of the above applications are all incorporated by reference as if fully set forth herein in their entirety.

FIELD AND BACKGROUND OF THE INVENTION

The present application relates to a technical field of displays, and particularly to manufacturing of a display device, and more particularly to a display panel.

Organic light-emitting diode (OLED) display panels have characteristics of relatively simple component structures, low production cost, being more energy efficient, and being bendable, and are widely used in various applications.

Currently, OLED display panels achieve bendable characteristics through flexible substrates. A large number of polarizable charges in the flexible substrates tend to be polarized to form a large number of polarized charges, which will polarize active layers of transistors of pixel circuits, resulting in low reliability of transistors, and reducing quality of the OLED display panels.

Therefore, it is imperative to improve the reliability of the transistors in pixel circuits in current OLED panels is low.

SUMMARY OF THE INVENTION

An object of the present application is to provide a display panel to solve a problem of low reliability of transistors in conventional organic light-emitting diode (OLED) display panels caused by polarization from substrates on active layers of transistors of pixel circuits.

In order to achieve the above-mentioned object, embodiments of the present application provide a display panel, including a substrate, a thin-film transistor layer disposed on the substrate and comprising a plurality of thin-film transistors, an auxiliary layer disposed between the substrate and the thin-film transistor layer and comprising a first auxiliary layer and at least a second auxiliary layer disposed on a side of the first auxiliary layer close to the substrate. The second auxiliary layer includes a plurality of auxiliary portions and a gap located between adjacent ones of the auxiliary portions. A dielectric constant of a constituent material of the first auxiliary layer is less than a dielectric constant of a constituent material of the substrate and is greater than a dielectric constant of a constituent material of the second auxiliary layer.

The present application has advantageous effects as follows: the present application provides a display panel including a substrate, a thin-film transistor layer disposed on the substrate and including a plurality of thin-film transistors, and an auxiliary layer disposed between the substrate and the thin-film transistor layer and including a first auxiliary layer and at least a second auxiliary layer disposed on a side of the first auxiliary layer close to the substrate. The second auxiliary layer includes a plurality of auxiliary portions and a gap located between adjacent ones of the auxiliary portions. Specifically, a dielectric constant of a constituent material of the first auxiliary layer is less than a dielectric constant of a constituent material of the substrate and is greater than a dielectric constant of a constituent material of the second auxiliary layer. Specifically, in the present application, the influence on the charge movement in the active layer can be reduced by the arrangement of the first auxiliary layer having the dielectric constant less than that of the substrate and by the disposition of the second auxiliary layer having a smaller dielectric constant and including the auxiliary portions arranged at intervals, which can further reduce the influence on the charge movement in the active layer.

BRIEF DESCRIPTION OF THE SEVERAL VIEWS OF THE DRAWINGS

The present application will be further described below with reference to the accompanying drawings. It should be noted that the accompanying drawings in the following description merely illustrate some embodiments of the present application, and a person skilled in the art may still derive other drawings from these accompanying drawings without creative efforts.

DESCRIPTION OF SPECIFIC EMBODIMENTS OF THE INVENTION

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

In the description of the present application, it should be understood that the orientation or positional relationship indicated by the terms "upper", "lower", "near", "far away", "both ends", etc. is based on the orientation or position shown in the accompanying drawings relation. For example, "upper" only means that the surface is above the object, and specifically refers to directly above, obliquely above, or the upper surface, as long as it is above the level of the object; "two ends" refer to two opposite positions of an object that can be represented in the figure, and the two positions can be in direct or indirect contact with the object. The above orientation or positional relationship is only for the convenience of describing the present application and simplifying the description, rather than indicating or implying that the referred device or element must have a specific orientation or be constructed and operated in a particular orientation and therefore should not be construed as a limitation of the present application.

In addition, it should be noted that the accompanying drawings only provide structures and steps that are closely related to the present application, and some details that are not related to the application are omitted. The purpose is to simplify the drawings and make the application point clear at a glance, rather than indicating the actual device and method are exactly the same as the drawings, and are not limited to the actual device and method.

The present application provides a display panel, and the display panel includes, but is not limited to, the following embodiments and combinations between the following embodiments.

Figure 1:
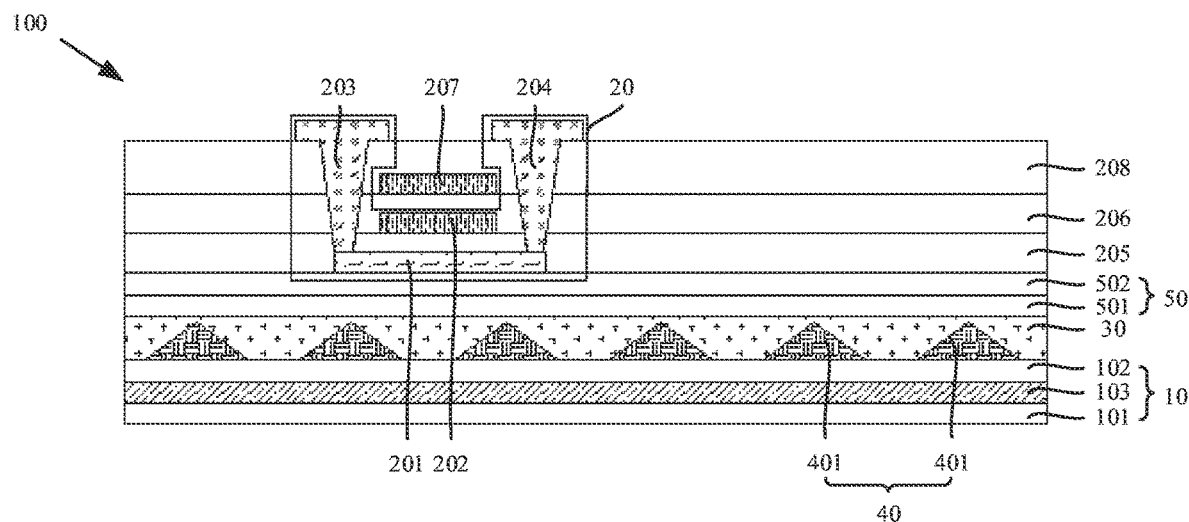
FIG. 1 is a schematic cross-sectional view of a display panel according to an embodiment of the present application.
Figure 2:
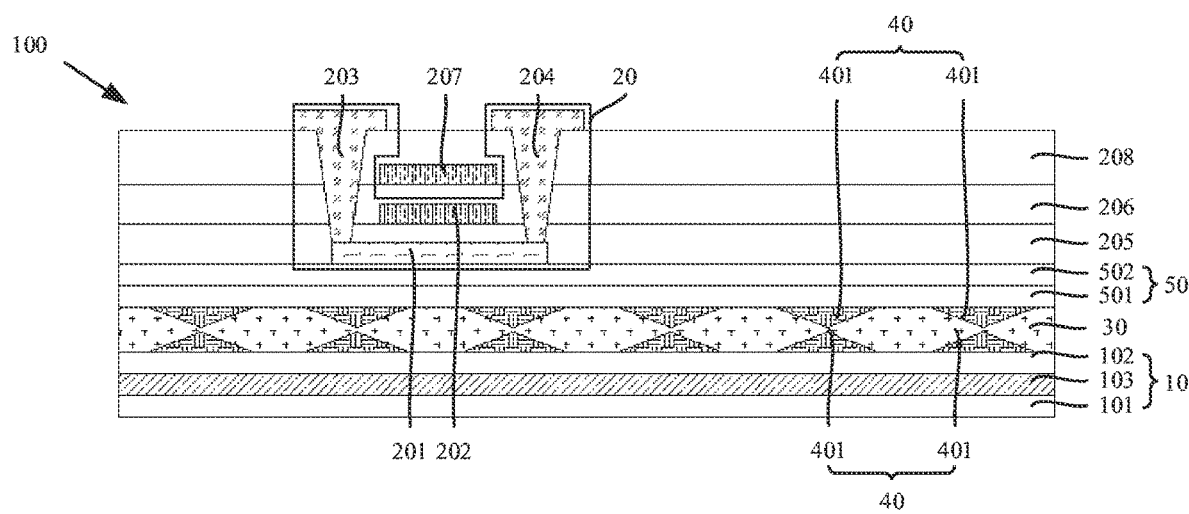
FIG. 2 is a schematic cross-sectional view of another display panel according to an embodiment of the present application.

In one embodiment, as shown in FIGS. 1 and 2, the display panel 100 includes a substrate 10, a thin-film transistor layer disposed on the substrate 10 and including a plurality of thin-film transistors 20, and an auxiliary layer disposed between the substrate 10 and the thin-film transistor layer and including a first auxiliary layer 30 and at least a second auxiliary layer 40 disposed on a side of the first auxiliary layer 30 close to the substrate 10. The second auxiliary layer 40 includes a plurality of auxiliary portions 401 and a gap located between adjacent ones of the auxiliary portions 401. Specifically, a dielectric constant of a constituent material of the first auxiliary layer 30 is less than a dielectric constant of a constituent material of the substrate 10 and is greater than a dielectric constant of a constituent material of the second auxiliary layer 40.

Specifically, the constituent material of the substrate 10 may include polyimide. Further, as shown in FIGS. 1 and 2, the substrate 10 may include a first substrate 101, a second substrate 102 located on the first substrate 101 close to the thin-film transistor layer, and a first buffer layer 103 located between the first substrate 101 and the second substrate 102. A constituent material of the first substrate 101 and a constituent material of the second substrate 102 may include polyimide. A constituent material of the first buffer layer 103 may include at least one of silicon oxide or silicon nitride. For example, the first buffer layer 103 made of silicon oxide has functions of water absorption and heat preservation, which can prolong service life of the display panel 100.

Specifically, as shown in FIGS. 1 and 2, the transistors 20 each may include an active layer 201, a gate layer 202 located on a side of the active layer 201 away from the substrate 10, a source and drain layer on a side of the gate layer 202 away from the substrate 10. The source and drain layer includes a source portion 203 disposed corresponding to and electrically connected to an end portion of the active layer 201, and a drain portion 204 disposed corresponding to and electrically connected to another end portion of the active layer 201. Further, the display panel 100 further includes a first insulating layer 205 located between the active layer 201 and the gate layer 202 and covering the active layer 201, a second insulating layer 206 covering the side of the gate layer 202 away from the substrate 10, a metal layer 207 on a side of the second insulating layer 206 away from the substrate 10, and an interlayer dielectric layer 208 located between the metal layer 207 and the source and drain layer and covering the metal layer 207.

Specifically, a constituent material of the active layer 201 may include at least one of amorphous silicon or polysilicon, and the polysilicon may include low temperature polysilicon. Further, the constituent material of the active layer 201 may also include oxide. It can be understood that, for example, using low temperature polysilicon technology to prepare the active layer 201 can have higher electron mobility. In this way, when the transistor 20 charges a corresponding pixel, a larger driving current can be generated to improve a charging speed; for example, the active layer 201 made of amorphous silicon or oxide can have a low leakage current, so as to prevent leakage of the transistor 20 from influencing signals under a condition of exposure. Specifically, for example, when the constituent material of the active layer 201 includes amorphous silicon, the two ends of the active layer 201 electrically connected to the source and drain layer can be doped with particles to form two doped regions. The dopant particles can include phosphorus ions, and a concentration of the dopant particles in the doped regions can be set according to actual situations. For example, when the constituent material of the active layer 201 includes oxide, it can be prevented to provide dopant particles to form a doped region.

Further, in conjunction with the above disclosure, as shown in FIGS. 1 and 2, the source and drain layer can be extended to be electrically connected to the active layer 201 through via holes penetrating the interlayer dielectric layer 208, the second insulating layer 206, and part of the first insulating layer 205. Specifically, a first via hole is connected to a side of one end of the active layer 201 away from the substrate 10 and a side of the interlayer dielectric layer 208 away from the substrate 10, a second via hole is connected to a side of the other end of the active layer 201 away from the substrate 10 and the side of the interlayer dielectric layer 208 away from the substrate 10, the source portion 203 is filled in the first via hole and extends to the side of the interlayer dielectric layer 208 away from the substrate 10, and the drain portion 204 is filled in the second via hole and extends to the side of the interlayer dielectric layer 208 away from the substrate 10. Specifically, the metal layer 207 may be disposed opposite to the gate layer 202 to form a corresponding capacitance in the pixel circuit.

Specifically, a constituent material of the first insulating layer 205, a constituent material of the second insulating layer 206, and a constituent material of the interlayer dielectric layer 208 may include at least one of an inorganic dielectric material or an organic dielectric material. The inorganic dielectric material can be silicon oxide, silicon nitride, or silicon oxynitride. The organic dielectric material may be a polyimide-based resin, an epoxy-based resin, or an acrylic-based resin material. Specifically, a constituent material of the gate layer 202, a constituent material of the metal layer 207, and a constituent material of the source and drain layer may include at least one of conductive materials, such as metals, metal oxides, metal nitrides, and metal oxynitrides. The metal can be copper, aluminum, molybdenum, or titanium It should be noted that, as shown in FIGS. 1 and 2, a large number of polarizable charges existing in the substrate 10 are susceptible to external influence or electric fields inside the display panel 100 and thus are polarized to become a large number of polarized charges. If no auxiliary layer is provided, a large number of polarized charges located on the side of the substrate 10 close to the thin-film transistor layer in the substrate 10 will cause polarization to the active layer 201, giving rise to influence on charge movement in the active layer 201, thus reducing reliability of the operation of the transistor 20.

It can be understood that in this embodiment, the dielectric constant of the constituent material of the first auxiliary layer 30 is less than the dielectric constant of the substrate 10. It can be seen from the law that "the greater the dielectric constant is, the easier it is to generate polarization", so it is more difficult for the first auxiliary layer 30 to be polarized relative to the substrate 10. Therefore, even if a large number of polarized charges are formed by polarizing the substrate 10 and the influence of the electric fields exist inside the display panel 100, a number of polarized charges formed by the polarization of the first auxiliary layer 30 between the substrate 10 and the transistor 20 can still be much less than a number of polarized charges formed by the polarization of the substrate 10 when the first auxiliary layer 30 is not provided. Therefore, the influence on the charge movement in the active layer 201 can be reduced, and the reliability of the operation of the transistor 20 can be improved.

Further, the dielectric constant of the constituent material of the second auxiliary layer 40 in this embodiment is less than the dielectric constant of the constituent material of the first auxiliary layer 30. Similarly, according to the above analysis, a number of polarized charges formed by the polarization of the second auxiliary layer 40 located on at least a side of the first auxiliary layer 30 close to the substrate 10 can still be much less than a number of polarized charges formed by the polarization of the first auxiliary layer 30 when the second auxiliary layer 40 is not provided. Therefore, the influence of the charge movement in the active layer 201 can be further reduced, and the reliability of the operation of the transistor 20 can be further improved.

In this embodiment, by setting the second auxiliary layer 40 to be composed of a plurality of auxiliary portions 401 arranged at intervals, it can be prevented that the second auxiliary layer 40 completely covers the substrate 10. When the display panel 100 is in at least one of the two situations that the display panel 100 includes a photosensitive device below the auxiliary layer or the substrate 10, or the display panel 100 is a bottom-emitting display device, an arrangement of the second auxiliary layer 40 can ensure light transmittance of the display panel 100, so as to prevent blocking more light, thus improving at least one of brightness of the display panel 100 and the reliability of the operation of the photosensitive device. Specifically, the shape and size of the auxiliary portion 401 are not limited in this embodiment.

It should be noted that although the dielectric constant of the constituent material of the second auxiliary layer 40 is relatively small, the light transmittance of the second auxiliary layer 40 is generally less than that of the first auxiliary layer 30, that is, although the second auxiliary layer 40 can weaken the polarization phenomenon in the active layer 201 to a further extent, it has the disadvantage of low light transmittance. However, as noted above, in this embodiment, the second auxiliary layer 40 is set to be composed of the auxiliary portions 401 arranged at intervals, in terms of the fact that "the dielectric constant of the constituent material of the second auxiliary layer 40 is less", in combination with the first auxiliary layer 30 having the constituent material with a higher light transmittance filled between adjacent ones of the auxiliary portions 401, in order to prevent light transmittance of a plane where the second auxiliary layer 40 is located from being too small.

In one embodiment, the first auxiliary layer 30 fills the gap. It can be seen from the above description that, on one hand, in this embodiment, the light transmittance of the display panel 100 can be effectively improved by forming a gap and filling the gap with the first auxiliary layer 30 with high light transmittance. On the other hand, due to a plurality of the gaps, the auxiliary portions 401 cannot be arranged to overlap the substrate 10, so that the auxiliary portions 401 cannot act on the entire substrate 10. This embodiment acts on the substrate 10 by filling the gap with the first auxiliary layer 30 whose dielectric constant is less than that of the substrate. In combination with the above description, that is, the number of polarized charges formed by the polarization of the first auxiliary layer 30 can still be much less than the number of polarized charges formed by the polarization of the substrate 10 when the first auxiliary layer 30 is not provided. On the basis that the second auxiliary layer 40 acts on the substrate 10, the influence on the charge movement in the active layer 201 can be further reduced by the first auxiliary layer 30.

In one embodiment, the second auxiliary layer 40 is a conductor. It can be understood that, on one hand, the dielectric constant of the conductor is close to zero. As noted above, the influence on the charge movement in the active layer 201 can be greatly reduced. On the other hand, the conductor is known in small resistivity and tends to conduct current, so there are a large number of freely movable charged particles in the conductor, which can attract the polarized charges formed by the polarization of the first auxiliary layer 30 with a relatively large dielectric constant, so as to homogenize the distribution of positively charged polarized charges and negatively charged polarized charges, and further enable recombination of the positively charged polarized charges and the negatively charged polarized charges, thereby reducing the number of polarized charges, diminishing directionality of polarization, and significantly reducing the influence on the charge movement in the active layer 201 as well.

Specifically, the constituent material of the second auxiliary layer 40 may include a metal conductor. Since electrical conductivity of the metal conductor is generally larger than that of other conductor materials, and the resistivity of the metal conductor generally decreases as temperature decreases. At extremely low temperatures, the resistivity of some metal conductors and alloys will disappear and become "superconductors", which can further reduce the influence on the charge movement in the active layer 201. Specifically, the metal conductor in this embodiment may be, but not limited to, indium tin oxide, silver element, molybdenum element, aluminum element, graphene, superconducting metal, and superconducting alloy. It can be understood that, compared with other metal conductors, the metal conductors listed above have higher light transmittance to prevent the light transmittance of the display panel 100 from being reduced to a considerable extent, and have a smaller elastic modulus to meet requirements of stress and strain of the display panel 100.

In one embodiment, as shown in FIGS. 1 and 2, a plurality of the auxiliary portions 401 are evenly arranged and are in direct contact with the surface of the substrate. It can be understood that, in combination with the above description, on one hand, the number of polarized charges formed by the polarization of the second auxiliary layer 40 is very small and the second auxiliary layer 40 is disposed close to the active layer 201, that is, each of the auxiliary portions 401 can diminish a polarization effect on the active layer 201 caused by a corresponding position in the substrate 10 and a corresponding position in the first auxiliary layer 30. Therefore, the evenly arranged auxiliary portions 401 can homogenize an area in the active layer 201 where the influence of the charge movement is diminished, and further optimize the way in which the influence of the charge movement in the active layer 201 is diminished; on the other hand, the evenly arranged auxiliary portions 401 can homogenize the arrangement of the corresponding gaps, so as to homogenize the light transmittance of each area in the display panel 100 and optimize the way in which the light transmittance of the display panel 100 is improved.

Further, when the second auxiliary layer 40 is a conductor, the evenly arranged auxiliary portions 401 in this embodiment can also homogenize an area in the second auxiliary layer 40 for attracting the polarized charges of the first auxiliary layer 30, further homogenize the charge distribution of the first auxiliary layer 30. In addition, an area in the second auxiliary layer 40 for recombining the polarized charges in the first auxiliary layer 30 can be further homogenized, so as to further diminish polarization directions of the first auxiliary layer 30. Therefore, the present embodiment can more significantly reduce the influence on the charge movement in the active layer 201.

In one embodiment, the first auxiliary layer 30 covers one side of the auxiliary portions 401 close to the thin-film transistor layer. Specifically, sides of the auxiliary portions 401 close to the first auxiliary layer 30 in this embodiment can be encompassed in the first auxiliary layer 30. On the basis that the auxiliary portions 401 are formed on the substrate 10 and a surface area of the auxiliary portions 401 is constant, other surfaces of the auxiliary portions 401 that are not in contact with the substrate 10 can all be in contact with the first auxiliary layer 30 to fully act on the polarizable charges in the first auxiliary layer 30 in order to reduce a number of polarized charges, thereby reducing the influence on the charge movement in the active layer 201. Further, as noted above, the first auxiliary layer 30 can cover the auxiliary portions 401 and fill the gap between adjacent ones of the auxiliary portions 401, and the first auxiliary layer 30 is further in direct contact with the surface of the substrate 10.

In one embodiment, a side of the auxiliary portion 401 adjoining the first auxiliary layer 30 includes at least one of a convex portion or a concave portion. Specifically, the side of each of the auxiliary portions 401 adjoining the first auxiliary layer 30 is in an uneven state. As noted above, a shape of the side of the first auxiliary layer 30 adjoining the second auxiliary layer 40 matches a shape of the side of the auxiliary portion 401 adjoining the first auxiliary layer 30, that is, the first auxiliary layer 30 adjoining the side of the second auxiliary layer 40 also includes at least one of the convex portion of the concave portion. It can be understood that in this embodiment, the side of the auxiliary portion 401 adjoining the first auxiliary layer 30 is convex in shape, and the shapes of the two sides close to each other are matched. That is, the second auxiliary layer 40 including very few polarized charges has a larger area in contact with the first auxiliary layer 30, and a proportion of the charges that can act on the first auxiliary layer 30 is larger. Correspondingly, the number of charges in the first auxiliary layer 30 that can be polarized by the substrate 10 is less, which can reduce the polarization effect on the active layer 201.

Further, when the second auxiliary layer 40 is a conductor, in this embodiment, the second auxiliary layer 40 and the first auxiliary layer 30 configured with larger oppositely arranged areas increase a local area of the second auxiliary layer 40 for attracting the polarized charges of the first auxiliary layer 30, thereby further improving an effect of homogenizing the charge distribution of the first auxiliary layer 30. In addition, an area of the second auxiliary layer 40 for recombining the polarized charges in the first auxiliary layer 30 is also increased, so as to further diminish the directionality of the polarization of the first auxiliary layer 30. Therefore, the present embodiment can more significantly reduce the influence on the charge movement in the active layer 201.

Specifically, a first distance defined between a surface of the first auxiliary layer 30 corresponding to part of the auxiliary portion 401 close to the thin-film transistor layer and the surface of the substrate 10 is greater than a second distance defined between a surface of the first auxiliary layer 30 corresponding to the gap close to the thin-film transistor layer and the surface of the substrate 10. It can be understood that, as noted above, a plurality of transistors are further provided on the first auxiliary layer 30. In this embodiment, the first distance is defined to be greater than the second distance, so that the side of the first auxiliary layer 30 close to the thin-film transistor layer is planarized, which can facilitate formation of stable transistors in a later stage and improve yield of processes. Further, a side of the first auxiliary layer 30 close to the thin-film transistor layer may be parallel to the substrate 10.

In one embodiment, a thickness of the first auxiliary layer 30 is less than 10 angstroms. It can be understood that since the first auxiliary layer 30 serves to reduce the influence of polarized charges in the substrate 10 on the charge movement in the active layer 201, and a thickness of the first auxiliary layer 30 is not expected to be large, the thickness of the first auxiliary layer 30 is limited to be less than 10 angstroms in this embodiment, which can prevent the thickness of the first auxiliary layer 30 from being too large to increase the thickness of the display panel 100 or affect stress of the display panel 100 while maintaining the function of the first auxiliary layer 30. Certainly, a thickness of the auxiliary portion 401 may also be greater than the thickness of the first auxiliary layer 30.

In one embodiment, as shown in FIG. 2, the second auxiliary layer 40 is further disposed on a side of the first auxiliary layer 30 away from the substrate 10, the auxiliary portions 401 of the second auxiliary layer 40 arranged on the side of the first auxiliary layer 30 away from the substrate 10 and the auxiliary portions 401 of the second auxiliary layer 40 arranged on the side of the first auxiliary layer 30 close to the substrate 10 are in a one-to-one correspondence with each other, and the two auxiliary portions 401 in the one-to-one correspondence are symmetrically disposed.

Specifically, after the first auxiliary layer 30 is formed, a plurality of grooves can be formed by, but not limited to, a photolithography process. The grooves may be disposed in a one-to-one correspondence with the auxiliary portions 401 in the second auxiliary layer 40 located on the side of the first auxiliary layer 30 close to the substrate 10, and the auxiliary portions 401 are then formed in the grooves by, but not limited to, physical vapor deposition, so as to form an additional second auxiliary layer 40 located on the side of the first auxiliary layer 30 close to the substrate 10. It can be understood that when the thickness of the first auxiliary layer 30 is greater than the thickness of the second auxiliary layer 40 on a side close to the substrate 10, the auxiliary portions 401 on a side away from the substrate 10 can be formed to further act on the polarized charges in the first auxiliary layer 30. Therefore, the influence on the charge movement in the active layer 201 is further reduced. In addition, since the two auxiliary portions 401 corresponding to each other are disposed opposite to each other, the light transmittance of the display panel 100 is also prevented from being additionally reduced.

In one embodiment, the constituent material of the first auxiliary layer 30 includes a polarized material. Specifically, the polarization can be understood as a phenomenon that the movement of current eventually causes potentials to deviate from open-circuit potentials of electrodes. The "polarized material" here can be understood as a material with polarization properties, for example, the substrate 10 can be polarized, or the first auxiliary layer 30 itself can be polarized. In one embodiment, the constituent material of the first auxiliary layer 30 includes amorphous silicon. Specifically, an adsorption force between the amorphous silicon and the substrate 10 is relatively large, which is favorable for the formation of the first auxiliary layer 30 and improves stability between the auxiliary layer and the substrate 10. Specifically, amorphous silicon can be prepared from natural silicon oxides with low cost. In addition, amorphous silicon is a semiconductor, which can reduce the influence of polarized charges in the substrate 10 on the charge movement of the active layer 201.

In one embodiment, as shown in FIGS. 1 and 2, the display panel 100 further includes a buffer layer 50 located on the side of the auxiliary layer close to the thin-film transistor layer. A constituent material of the buffer layer 50 includes at least one of silicon nitride or silicon oxide. It should be noted that a side of the auxiliary layer formed by the chemical vapor deposition process or the physical vapor deposition process close to the thin-film transistor layer will be rough. In this embodiment, the buffer layer 50 with a certain thickness may be formed by, but not limited to, a chemical vapor deposition process. That is, it can be understood that a side of the buffer layer 50 close to the thin-film transistor layer will be relatively flat, which is favorable for formation of the thin-film transistor layer.

Specifically, the buffer layer 50 formed by using at least one of silicon nitride or silicon oxide can have a function of absorbing water to prevent a light-emitting device from damage due to intrusion of outside moisture, and can also have a function of heat preservation to prevent sharp temperature changes in a manufacturing process, thereby reducing a risk of reliability of the active layer 201. Specifically, the buffer layer 50 may include a second buffer layer 501 and a third buffer layer 502 disposed on the second buffer layer 501. A constituent material of one of the second buffer layer 501 or the third buffer layer 502 may include silicon oxynitride. A constituent material of the other one of the second buffer layer 501 or the third buffer layer 502 may include silicon oxide. Still further, the buffer layer 50 may further include a third buffer layer made of silicon oxynitride. Further, a dielectric layer can also be provided between the buffer layer 50 and the thin-film transistor layer. The dielectric layer is configured to insulate the active layer 201 and other film layers, and a constituent material of the dielectric layer can refer to relevant descriptions on a constituent material of the buffer layer 50 above.

The present application further provides a method of manufacturing a display panel. The method includes, but is not limited to, the following embodiments and combinations of the following embodiments.

Figure 3:
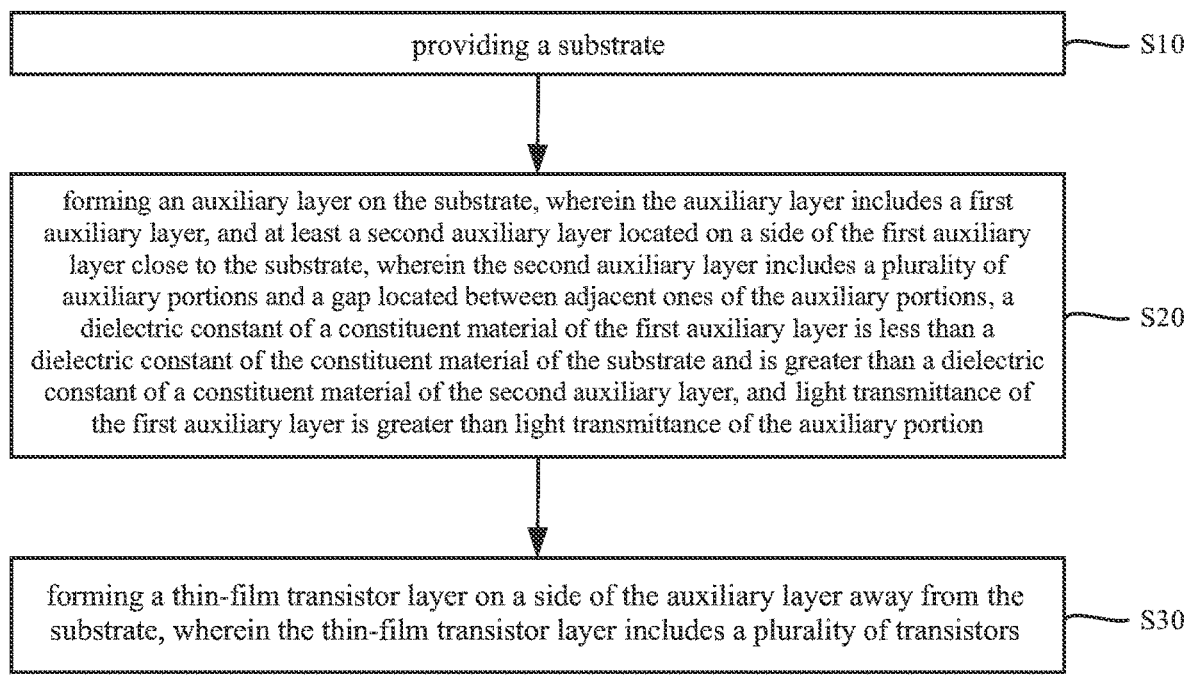
FIG. 3 is a flowchart of a method of manufacturing a display panel according to an embodiment of the present application.
Figure 4:
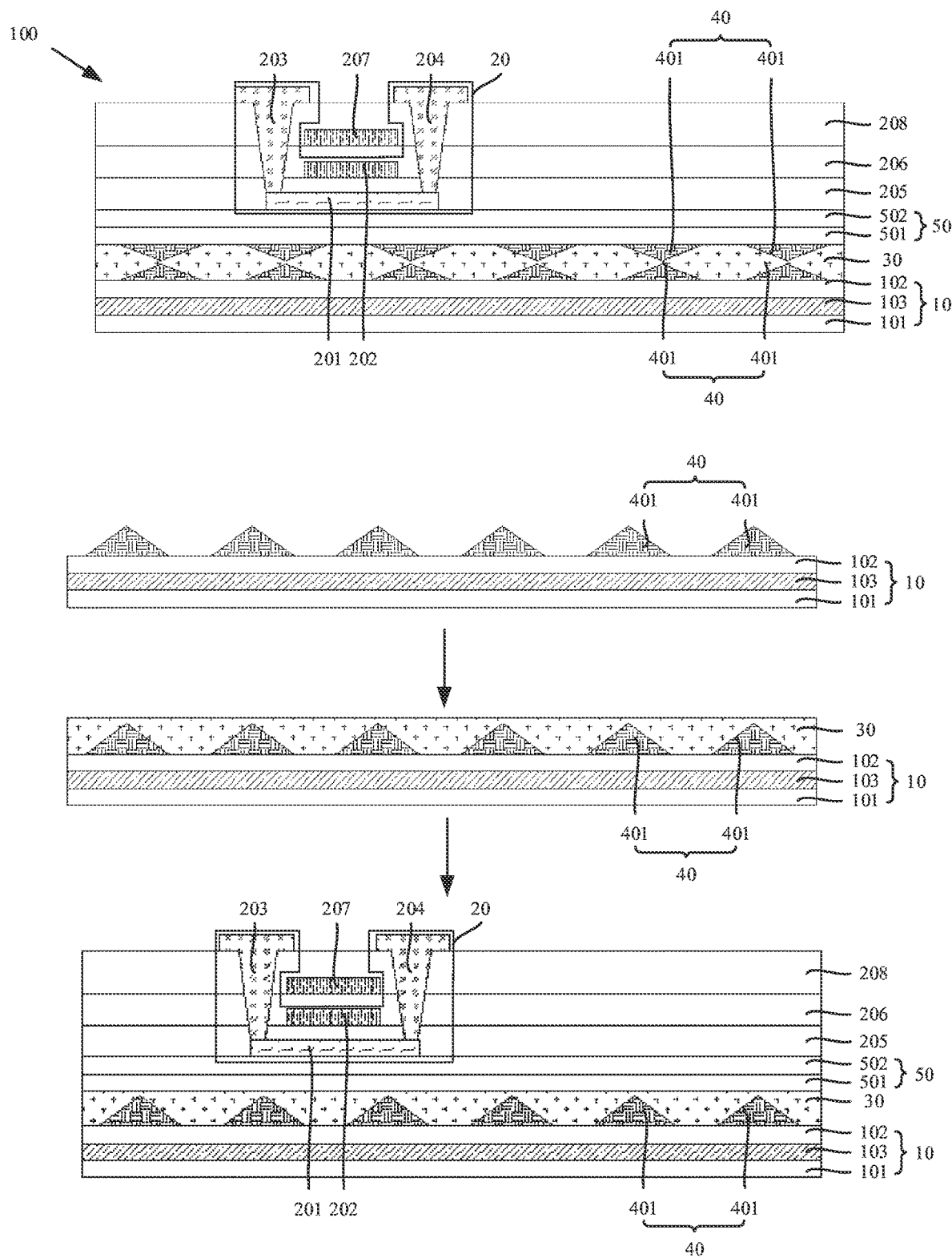
FIG. 4 is a schematic process flow diagram illustrating a method of manufacturing a display panel according to an embodiment of the present application.

In one embodiment, as shown in FIGS. 3 and 4, the method of manufacturing the display panel includes, but is not limited to, the following steps.

Step S10: providing a substrate 10.

Specifically, as shown in FIGS. 1 to 4, the substrate 10 may include a first substrate 101, a second substrate 102 located on the first substrate 101 close to a thin-film transistor layer, and a first buffer layer 103 located between the first substrate 101 and the second substrate 102. A constituent material of the first substrate 101 and a constituent material of the second substrate 102 may include polyimide. A constituent material of the first buffer layer 103 may include at least one of silicon oxide or silicon nitride. For example, the first buffer layer 103 made of silicon oxide has functions of water absorption and heat preservation, which can prolong service life of the display panel 100.

Step S20: forming an auxiliary layer on the substrate, wherein the auxiliary layer includes a first auxiliary layer, and at least a second auxiliary layer located on a side of the first auxiliary layer close to the substrate, wherein the second auxiliary layer includes a plurality of auxiliary portions and a gap located between adjacent ones of the auxiliary portions, a dielectric constant of a constituent material of the first auxiliary layer is less than a dielectric constant of the constituent material of the substrate and is greater than a dielectric constant of a constituent material of the second auxiliary layer, and light transmittance of the first auxiliary layer is greater than light transmittance of the auxiliary portion.

It should be noted that, as noted above, if no auxiliary layer is provided, after a large number of polarizable charges in the substrate 10 are polarized to be a large number of polarized charges, an active layer 201 will undergo a polarization effect, giving rise to influence on the charge movement in the active layer 201.

Specifically, as shown in FIGS. 1 to 4, the second auxiliary layer 40 is located at least on the side of the first auxiliary layer 30 close to the substrate 10, that is, the second auxiliary layer 40 may be formed before the first auxiliary layer 30 is formed. Specifically, the second auxiliary layer 40 may be formed at least on the second substrate 102 by physical vapor deposition. For example, a surface of a material source of a constituent material of the second auxiliary layer 40 is vaporized into gaseous atoms or molecules, or partially ionized into ions, and through a plasma process, and the second auxiliary layer 40 is deposited on the surface of the second substrate 102 to form the second auxiliary layer 40. It should be noted that the energy used for depositing the second auxiliary layer 40 may be relatively small, so as to prevent the constituent material of the second auxiliary layer 40 from splashing into the substrate 10 and even causing the substrate 10 to be lifted.

On this basis, further, a mask with a plurality of openings can be used in combination with physical vapor deposition to deposit and form a plurality of auxiliary portions 401 corresponding to the openings on the surface of the second substrate 102 to form the second auxiliary layer 40. Specifically, a number and arrangement of the auxiliary portions 401 are not limited here, and reference may be made to the relevant description of the auxiliary portions 401 above.

Specifically, as shown in FIGS. 1 to 4, after the second auxiliary layer 40 is formed, the first auxiliary layer 30 may be formed on the second auxiliary layer 40 by chemical deposition. The first auxiliary layer 30 may cover part or all of the second auxiliary layer 40. Specifically, as shown in FIGS. 1, 2, and 4, taking the second auxiliary layer 40 including the auxiliary portions 401 arranged at intervals as an example for description, the constituent material of the first auxiliary layer 30 may be deposited on the substrate 10 and the auxiliary portions 401 to form the first auxiliary layer 30. Specifically, a thickness of the first auxiliary layer 30 is less than or equal to 10 angstroms.

It can be understood that in this embodiment, the dielectric constant of the constituent material of the first auxiliary layer 30 is less than the dielectric constant of the substrate 10. It can be seen from the law that "the greater the dielectric constant is, the easier it is to generate polarization", so it is more difficult for the first auxiliary layer 30 to be polarized relative to the substrate 10. Therefore, even if a large number of polarized charges are formed by polarizing the substrate 10 and the influence of the electric fields exist inside the display panel 100, a number of polarized charges formed by the polarization of the first auxiliary layer 30 between the substrate 10 and the transistor 20 can still be much less than a number of polarized charges formed by the polarization of the substrate 10 when the first auxiliary layer 30 is not provided. Therefore, the influence on charge the movement in the active layer 201 can be reduced, and the reliability of the operation of the transistor 20 can be improved.

Further, the dielectric constant of the constituent material of the second auxiliary layer 40 in this embodiment is less than the dielectric constant of the constituent material of the first auxiliary layer 30. Similarly, according to the above analysis, a number of polarized charges formed by the polarization of the second auxiliary layer 40 located on at least a side of the first auxiliary layer 30 close to the substrate 10 can still be much less than a number of polarized charges formed by the polarization of the first auxiliary layer 30 when the second auxiliary layer 40 is not provided. Therefore, the influence of the charge movement in the active layer 201 can be further reduced, and the reliability of the operation of the transistor 20 can be further improved.

It should be noted that although the dielectric constant of the second auxiliary layer 40 is relatively small, its light transmittance is relatively large compared to that of the first auxiliary layer 30. That is, although the second auxiliary layer 40 can further diminish the polarization effect in the active layer 201, it has the disadvantage of low light transmittance. It can be understood that in this embodiment, by setting the second auxiliary layer 40 to be composed of a plurality of auxiliary portions 401 arranged at intervals, it can be prevented that the second auxiliary layer 40 completely covers the substrate 10. When the display panel 100 is in at least one of the two situations that the display panel 100 includes a photosensitive device below the auxiliary layer or the substrate 10, or the display panel 100 is a bottom-emitting display device, an arrangement of the second auxiliary layer 40 can ensure light transmittance of the display panel 100, so as to prevent blocking more light, thus improving at least one of brightness of the display panel 100 and the reliability of the operation of the photosensitive device. Specifically, the shape and size of the auxiliary portion 401 are not limited in this embodiment.

Step S30: forming a thin-film transistor layer on a side of the auxiliary layer away from the substrate, wherein the thin-film transistor layer includes a plurality of transistors.

Specifically, as shown in FIGS. 1, 2, and 4, a plurality of transistors 20 each may include an active layer 201, a gate layer 202 located on a side of the active layer 201 away from the substrate 10, a source and drain layer on a side of the gate layer 202 away from the substrate 10. The source and drain layer includes a source portion 203 disposed corresponding to and electrically connected to an end portion of the active layer 201, and a drain portion 204 disposed corresponding to and electrically connected to another end portion of the active layer 201. Further, the display panel 100 further includes a first insulating layer 205 located between the active layer 201 and the gate layer 202 and covering the active layer 201, a second insulating layer 206 covering the side of the gate layer 202 away from the substrate 10, a metal layer 207 on a side of the second insulating layer 206 away from the substrate 10, and an interlayer dielectric layer 208 located between the metal layer 207 and the source and drain layer and covering the metal layer 207. Specifically, for the relevant description of the specific structure of the transistor 20, reference may be made to the relevant description of the specific structure in the transistor 20 above.

Further, as shown in FIGS. 1, 2, and 4 and as described above, prior to forming the thin-film transistor layer, a buffer layer 50 may be formed on the side of the auxiliary layer away from the substrate 10. For example, the second buffer layer 501 may be formed on the side of the auxiliary layer away from the substrate 10, and then the third buffer layer 502 may be formed on the side of the second buffer layer 501 away from the substrate 10. For a constituent material of the second buffer layer 501 and a constituent material of the third buffer layer 502, reference may be made to the above related descriptions.

Specifically, for example, when the constituent material of the active layer 201 includes amorphous silicon, an amorphous silicon material can be used to form the active layer 201 directly on the side of the buffer layer 50 away from the substrate 10. Certainly, an excimer laser annealing process can also be used to process an amorphous silicon thin film to form a polysilicon thin film, and then the active layer 201 can be formed by patterning. Specifically, for the active layer 201 made of amorphous silicon, dopant particles can be implanted into both ends of the active layer 201 to form two impurity regions, and then the first insulating layer 205 covering the active layer 201 is formed. Alternatively, the first insulating layer 205 covering the active layer 201 may be formed first, and then dopant particles are implanted into the first insulating layer 205 to indirectly flow into the both ends of the active layer 201 to form two the impurity regions. Specifically, the gate layer 202 may be formed on the side of the first insulating layer 205 away from the substrate 10 by, but not limited to, an evaporation process or a physical vapor deposition process, along with a patterning process. Further, an orthographic projection of the gate layer 202 on a plane where the active layer 201 is located may be located within a boundary of the active layer 201. The gate layer 202 can serve as a blocking portion, and dopant particles can be implanted into part of the active layer 201 beyond the gate layer 202 to promote formation of two impurity regions. A concentration of this doping may be higher than that of a previous doping. Specifically, the second insulating layer 206 can be formed to cover the gate layer 202, and then the metal layer 207 can be formed on the second insulating layer 206 by, but not limited to, an evaporation process or a physical vapor deposition process, along with a patterning process. The metal layer 207 and the gate layer 202 are disposed opposite to each other to form a capacitor. Specifically, the interlayer dielectric layer 208 may be formed to cover the metal layer 207, and then two via holes may be formed to extend through the interlayer dielectric layer 208, the second insulating layer 206, and part of the first insulating layer 205. The two via holes are connected to the two ends of the active layer 201 and a side of the interlayer dielectric layer 208 away from the substrate 10, then the via holes are filled with the constituent materials of the source and drain layer and extend to the side of the interlayer dielectric layer 208 away from the substrate 10, and a patterning process is used to form the source portion 203 and the drain portion 204. Still further, film layers, such as a light-emitting layer, a pixel definition layer, and an encapsulation layer may be formed on the side of the interlayer dielectric layer 208 away from the substrate 10 and a side of the source and drain layer away from the substrate 10.

The present application provides a display panel including a substrate, a thin-film transistor layer disposed on the substrate and including a plurality of thin-film transistors, and an auxiliary layer disposed between the substrate and the thin-film transistor layer and including a first auxiliary layer and at least a second auxiliary layer disposed on a side of the first auxiliary layer close to the substrate. The second auxiliary layer includes a plurality of auxiliary portions and a gap located between adjacent ones of the auxiliary portions. Specifically, a dielectric constant of a constituent material of the first auxiliary layer is less than a dielectric constant of a constituent material of the substrate and is greater than a dielectric constant of a constituent material of the second auxiliary layer. Specifically, in the present application, the influence on the charge movement in the active layer can be reduced by the arrangement of the first auxiliary layer having the dielectric constant less than that of the substrate and by the disposition of the second auxiliary layer having a smaller dielectric constant and including the auxiliary portions arranged at intervals, which can further reduce the influence on the charge movement in the active layer.

The structure of the display panel provided by the embodiments of the present application is described in detail above. The principles and implementations of the present application are described with specific examples herein. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. A display panel, comprising:
   a substrate;
   a thin-film transistor layer disposed on the substrate and comprising a plurality of thin-film transistors; and
   an auxiliary layer disposed between the substrate and the thin-film transistor layer and comprising a first auxiliary layer and at least a second auxiliary layer disposed on a side of the first auxiliary layer close to the substrate, wherein the second auxiliary layer comprises a plurality of auxiliary portions and a gap located between adjacent ones of the auxiliary portions;
   wherein a dielectric constant of a constituent material of the first auxiliary layer is less than a dielectric constant of a constituent material of the substrate and is greater than a dielectric constant of a constituent material of the second auxiliary layer;
   wherein the first auxiliary layer comprises a polarized material and the second auxiliary layer comprises a conductive material;
   wherein the auxiliary portions are evenly arranged on the substrate and are in direct contact with a surface of the substrate;
   wherein an additional second auxiliary layer is further disposed on a side of the first auxiliary layer away from the substrate, the auxiliary portions of the additional second auxiliary layer arranged on the side of the first auxiliary layer away from the substrate and the auxiliary portions of the second auxiliary layer arranged on the side of the first auxiliary layer close to the substrate are in a one-to-one correspondence, and the two auxiliary portions in the one-to-one correspondence are symmetrically disposed.

2. The display panel of claim 1, wherein light transmittance of the first auxiliary layer is greater than light transmittance of the auxiliary portion.

3. The display panel of claim 1, wherein the first auxiliary layer comprises amorphous silicon, and the second auxiliary layer comprises a metal conductor.

4. The display panel of claim 1, wherein the first auxiliary layer fills the gap between the adjacent ones of the auxiliary portions and is further in direct contact with the surface of the substrate.

5. The display panel of claim 4, wherein a thickness of the first auxiliary layer is less than or equal to 10 angstroms.

6. The display panel of claim 4, wherein a side of the auxiliary portion close to the first auxiliary layer comprises at least one of a convex portion or a concave portion.

7. The display panel of claim 4, wherein a first distance defined between a surface of the first auxiliary layer corresponding to part of the auxiliary portion close to the thin-film transistor layer and the surface of the substrate is greater than a second distance defined between a surface of the first auxiliary layer corresponding to the gap close to the thin-film transistor layer and the surface of the substrate.

8. A display panel, comprising:
   a substrate;
   a thin-film transistor layer disposed on the substrate and comprising a plurality of thin-film transistors;
   an auxiliary layer disposed between the substrate and the thin-film transistor layer and comprising a first auxiliary layer and at least a second auxiliary layer disposed on a side of the first auxiliary layer close to the substrate, wherein the second auxiliary layer comprises a plurality of auxiliary portions and a gap located between adjacent ones of the auxiliary portions;
   wherein a dielectric constant of a constituent material of the first auxiliary layer is less than a dielectric constant of a constituent material of the substrate and is greater than a dielectric constant of a constituent material of the second auxiliary layer;
   wherein the first auxiliary layer comprises a polarized material and the second auxiliary layer comprises a conductive material;
   wherein an additional second auxiliary layer is further disposed on a side of the first auxiliary layer away from the substrate, the auxiliary portions of the additional second auxiliary layer arranged on the side of the first auxiliary layer away from the substrate and the auxiliary portions of the second auxiliary layer arranged on the side of the first auxiliary layer close to the substrate are in a one-to-one correspondence, and the two auxiliary portions in the one-to-one correspondence are symmetrically disposed.

9. The display panel of claim 8, wherein light transmittance of the first auxiliary layer is greater than light transmittance of the auxiliary portion.

10. A display panel, comprising:
    a substrate;
    a thin-film transistor layer disposed on the substrate and comprising a plurality of thin-film transistors; and
    an auxiliary layer disposed between the substrate and the thin-film transistor layer and comprising a first auxiliary layer and at least a second auxiliary layer disposed on a side of the first auxiliary layer close to the substrate, wherein the second auxiliary layer comprises a plurality of auxiliary portions and a gap located between adjacent ones of the auxiliary portions;
    wherein a dielectric constant of a constituent material of the first auxiliary layer is less than a dielectric constant of a constituent material of the substrate and is greater than a dielectric constant of a constituent material of the second auxiliary layer;
    wherein an additional second auxiliary layer is further disposed on a side of the first auxiliary layer away from the substrate, the auxiliary portions of the additional second auxiliary layer arranged on the side of the first auxiliary layer away from the substrate and the auxiliary portions of the second auxiliary layer arranged on the side of the first auxiliary layer close to the substrate are in a one-to-one correspondence, and the two auxiliary portions in the one-to-one correspondence are symmetrically disposed; and wherein a side of the auxiliary portion close to the first auxiliary layer comprises at least one of a convex portion or a concave portion.

11. The display panel of claim 10, wherein light transmittance of the first auxiliary layer is greater than light transmittance of the auxiliary portion.

12. The display panel of claim 11, wherein the first auxiliary layer comprises amorphous silicon, and the second auxiliary layer comprises a metal conductor.

13. The display panel of claim 10, wherein the auxiliary portions are evenly arranged on the substrate and are in direct contact with a surface of the substrate.

14. The display panel of claim 13, wherein the first auxiliary layer fills the gap between the adjacent ones of the auxiliary portions and is further in direct contact with the surface of the substrate.

15. The display panel of claim 14, wherein a thickness of the first auxiliary layer is less than or equal to 10 angstroms.

16. The display panel of claim 14, wherein a first distance defined between a surface of the first auxiliary layer corresponding to part of the auxiliary portion close to the thin-film transistor layer and the surface of the substrate is greater than a second distance defined between a surface of the first auxiliary layer corresponding to the gap close to the thin-film transistor layer and the surface of the substrate.

\* \* \* \* \*